United States Patent [19]
Murakami

[11] Patent Number: 5,729,441
[45] Date of Patent: Mar. 17, 1998

[54] ELECTROMAGNETIC SHIELDING DEVICE FOR USE IN ELECTRONIC APPLIANCES

[75] Inventor: Takuo Murakami, Tokyo, Japan

[73] Assignee: Mitsubishi Denki Kabushiki Kaisha, Tokyo, Japan

[21] Appl. No.: 580,318

[22] Filed: Dec. 28, 1995

[30] Foreign Application Priority Data

May 31, 1995 [JP] Japan ................................. 7-134209

[51] Int. Cl.⁶ ...................................... H05K 5/00
[52] U.S. Cl. .................. 361/818; 174/35 R; 361/816; 361/753
[58] Field of Search ..................... 361/753, 800, 361/816, 818; 174/35 GC, 35 R, 35 MS

[56] References Cited

U.S. PATENT DOCUMENTS

| | | | |
|---|---|---|---|
| 5,579,210 | 11/1996 | Ruhland et al. | 361/816 |
| 5,596,173 | 1/1997 | Yi | 174/5 |

FOREIGN PATENT DOCUMENTS

| | | |
|---|---|---|
| 1-26152 | 8/1989 | Japan . |
| 2151411 | 7/1985 | United Kingdom . |
| 2152291 | 7/1985 | United Kingdom . |

*Primary Examiner*—Kristine L. Kincaid
*Assistant Examiner*—Hung V. Ngo

[57] ABSTRACT

An electromagnetic shielding device includes a shield member inserted into a slot of a chassis so that the inserted portion is located adjacent to circuitry components on a printed circuit board, the non-inserted portion of the shield member being held between one of the sides of the chassis and a covering placed over the chassis.

23 Claims, 9 Drawing Sheets

ELECTROMAGNETIC SHIELDING DEVICE FOR USE IN ELECTRONIC APPLIANCES

BACKGROUND OF THE INVENTION

1. Field of the Invention

The present invention relates to an electromagnetic shielding device for use in electronic appliances.

2. Description of Related Art

Electronic appliances are equipped with a shielding device so as to protect the users and other components from electromagnetic wave radiated from the circuits built in the appliances.

FIG. 1 is a schematic cross-section showing an example of the known electromagnetic shielding devices.

The illustrated electronic appliance includes circuitry components 1a mounted on a printed circuit board 1. The circuitry components 1a radiate electromagnetic wave at a radiation position 7 which is covered with a shield case 6 made of a material capable of shielding electromagnetic wave. The shield case 6 is fixed to a chassis 2 made of plastics, to which the printed circuit board 1 is fixed. When this case 6 is made of a electrically conducting material (hereinafter "conductor") such as metal, it is directly or indirectly fixed, through soldering or any other conductor, to the printed circuit board 1 or the chassis 2 wherein the case 6 is electrically connected to a low-impedance reference potential section of the circuitry component 1a. The chassis 2 is covered with a covering 3 having a corresponding shape to that of the chassis 2. The chassis 2 and the covering 3 are joined together by means of screws 10, the side section 3a of the covering 3 being attached to the side section 2a of the chassis 2.

FIG. 2 is a schematic cross-section showing another example of a known shielding device. The printed circuit board 1 including the radiation position 7 is wholly covered with a shield case 6 which is fixed to any structure or a chassis (not shown). Likewise, when this case 6 is made of conductor such as metal, it is directly fixed to a low-impedance reference potential section of the circuitry component 1a, or indirectly fixed through soldering or any conductor to and electrically connected to any structure or a chassis not shown.

FIG. 3 is a schematic cross-section showing a further example of a known shielding device. A shieldable covering 13 having a channel-like cross-section is placed over a chassis 2 on which a printed circuit board 1 is mounted, and a shieldable tray 14 having a protrusion having a trapezoidal cross-section is placed under the chassis 2 having an opening 11 in which the protrusion of the tray is insertedly held. The top surface of the protrusion is kept in contact with a low-impedance reference potential section of the circuit. The erected sides 14a of the tray 14 are tightly sandwiched between the outer surfaces of the sides 2a of the chassis 2, and are joined together by means of screws 10. When the covering 13 and the tray 14 are made of conductor such as metal, they are electrically kept in contact with a low-impedance reference potential section of the circuit through a conductor not shown. The covering 13 and the tray 14 are mounted by means of screws 10 as described above, or mounted through adhesives, soldering, or by employing a claw.

In the first example shown in FIG. 1 a major disadvantage is that a special space is required for attaching the shield case to the printed circuit board, thereby leading to a reduced space for mounting circuitry components on the printed circuit board. As a result, the number of components to be mounted on the printed circuit board is reduced. In addition, when the shield case is made of conductor, it may happen that it cannot be electrically connected to a low-impedance reference potential section of the circuit depending upon a layout of the printed circuit.

In the second example shown in FIG. 2 the shield case is shaped so as to cover the whole printed circuit board including an electromagnetic wave-free portion. As a result, a space for mounting circuitry components is not restricted, but the size of the shield case becomes unnecessarily large, and occupies a large space to no purpose.

In the third example shown in FIG. 3, when the whole electronic appliance is covered by the shieldable material, the strength, cost, and design of the covering are difficult to determine and to use for practical purposes. Especially when electromagnetic wave is radiated from a particular area in the circuit, a greater part of the shieldable material constituting the covering will serve no purpose, thereby leading to a waste of material.

A further disadvantage of this example is that since the covering and the tray are fixed by different screws, an increased number of fasteners must be used, thereby increasing the assembling processes. This increases the production cost. When soldering is used to join the covering, the chassis and the tray, the space for mounting components is reduced by the soldering space.

SUMMARY OF THE INVENTION

The present invention is directed to solve the problems pointed out above, and an object of the present invention is to provide an electromagnetic shielding device which is attachable to a chassis of an electronic appliance without reducing a space or site (hereinafter "site") for mounting circuitry components on a printed circuit board, and with a minimum of assembling processes using a reduced number of fasteners, etc.

According to one aspect of the present invention, an electro-magnetic shielding device includes a chassis having a slot therein; and an electromagnetic wave shield member inserted into the slot of the chassis until the inserted portion is located adjacent to a source generating an electromagnetic wave, the other portion of the shield member being located outside the chassis.

In a preferred embodiment a covering is additionally provided to cover the chassis, and the other portion of the shield member is held between the covering and the chassis.

Preferably, the printed circuit board is housed in the chassis.

Accordingly, the shield member is provided adjacent to the circuitry components likely to radiate electromagnetic wave in a non-contact manner, so that the shield member is prevented from reducing a site for mounting circuitry components on the printed circuit board. The shield member is fixed by mounting the covering on the chassis.

In a further preferred embodiment, the covering is made of conductor and is electrically connected to the shield member, so that the covering can shield against electromagnetic wave.

In a still further preferred embodiment the shield member is electrically connected to a reference potential section of the circuits on the printed circuit board, so that since it is maintained at the reference potential, the potential thereof is not affected by the electromagnetic wave radiated from the circuitry components.

Preferably, the covering is electrically connected to a reference potential section of the circuits on the printed circuit board, so that since it is maintained at the reference potential, the potential thereof is not affected by the electromagnetic wave radiated from the circuitry components.

The above and further objects and features of the present invention will more fully be apparent from the following detailed description and the accompanying drawings which are given by way of illustration only, and thus are not limitative of the present invention.

DESCRIPTION OF THE PREFERRED EMBODIMENTS

Hereinafter, the invention will be described in detail with reference to the drawings showing its embodiments.

EXAMPLE 1

Figure 1:
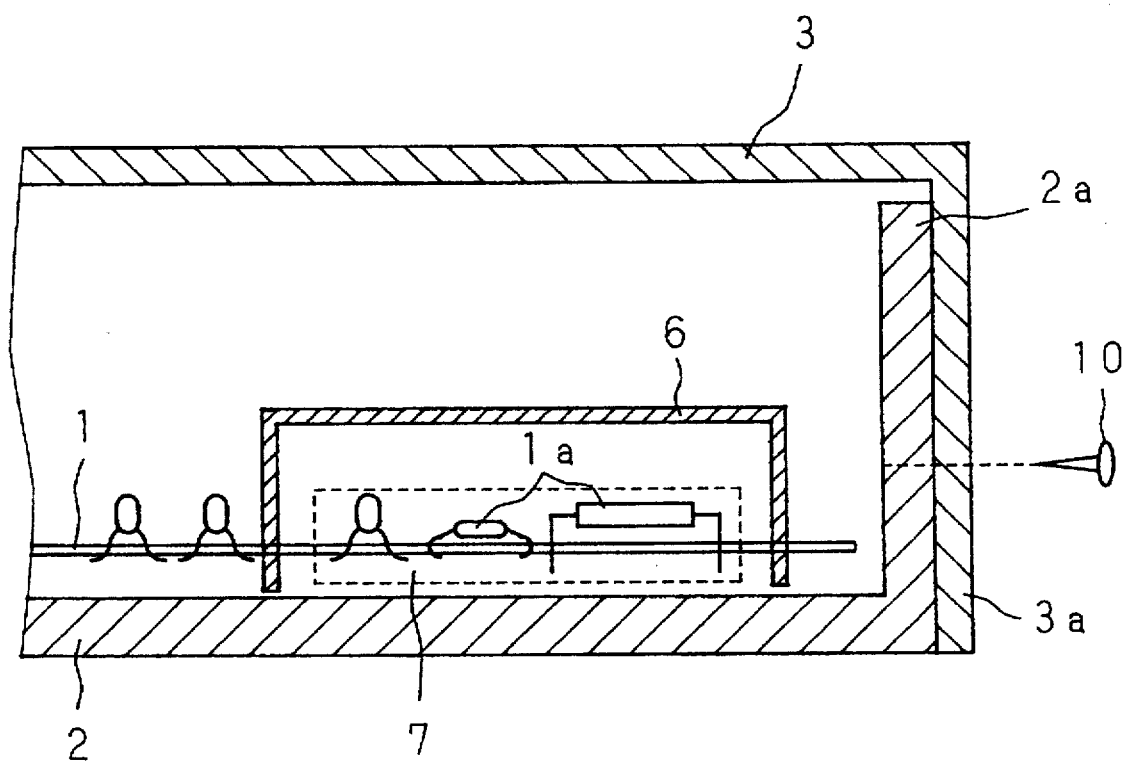
FIG. 1 is a schematic cross-section showing a prior art electromagnetic shielding device.
Figure 2:
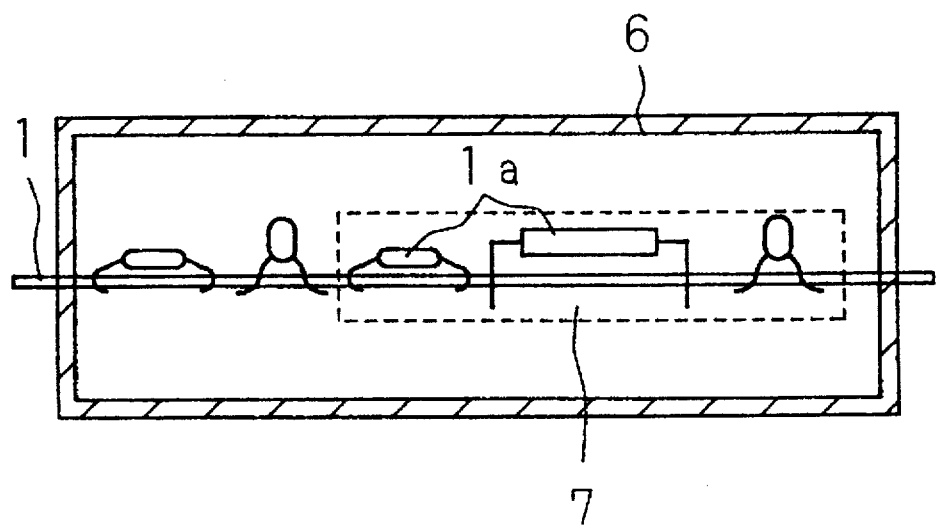
FIG. 2 is a schematic cross-section showing another example of prior art electromagnetic shielding device.
Figure 3:
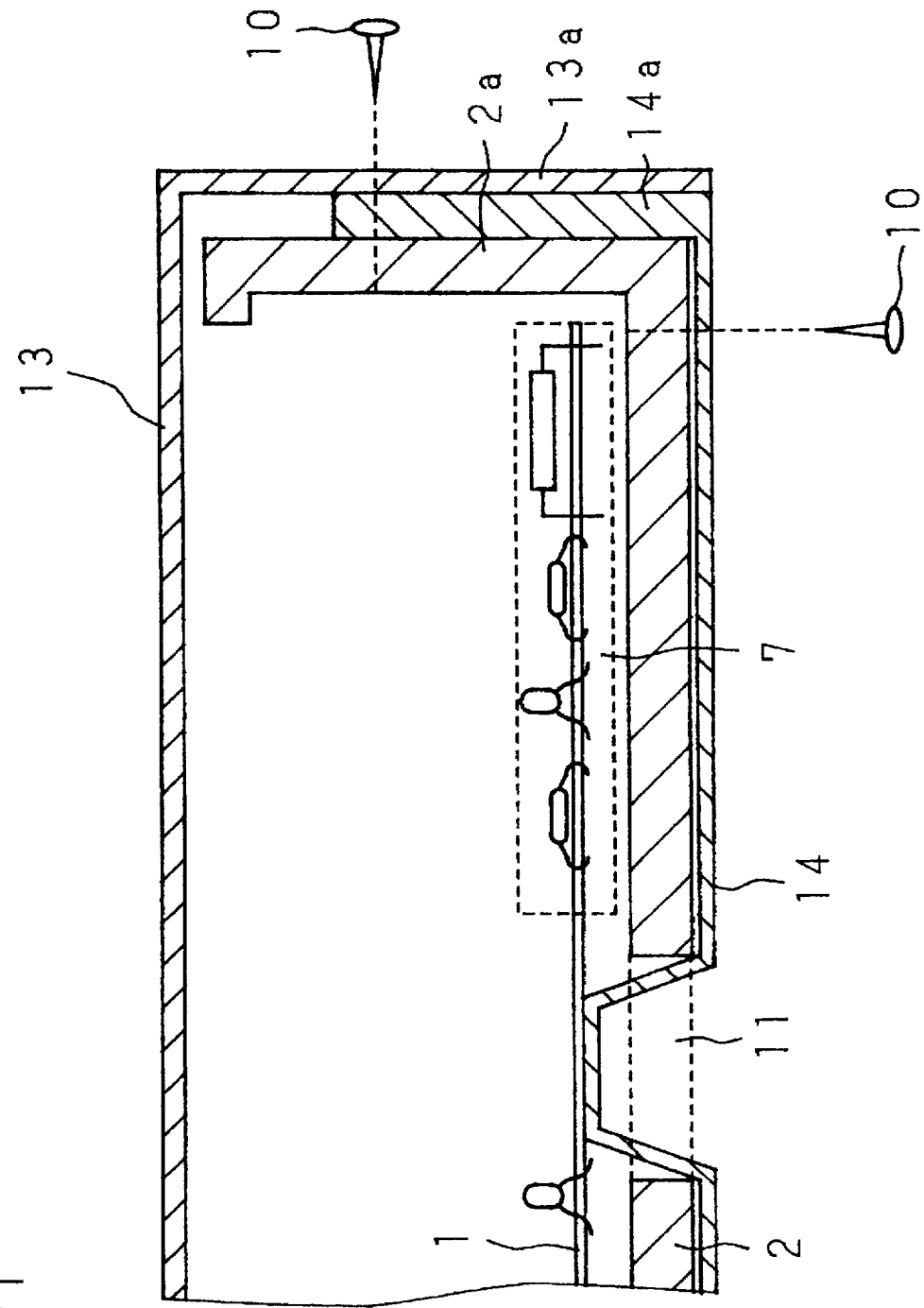
FIG. 3 is a schematic cross-section showing a further example of prior art electromagnetic shielding device.
Figure 4:
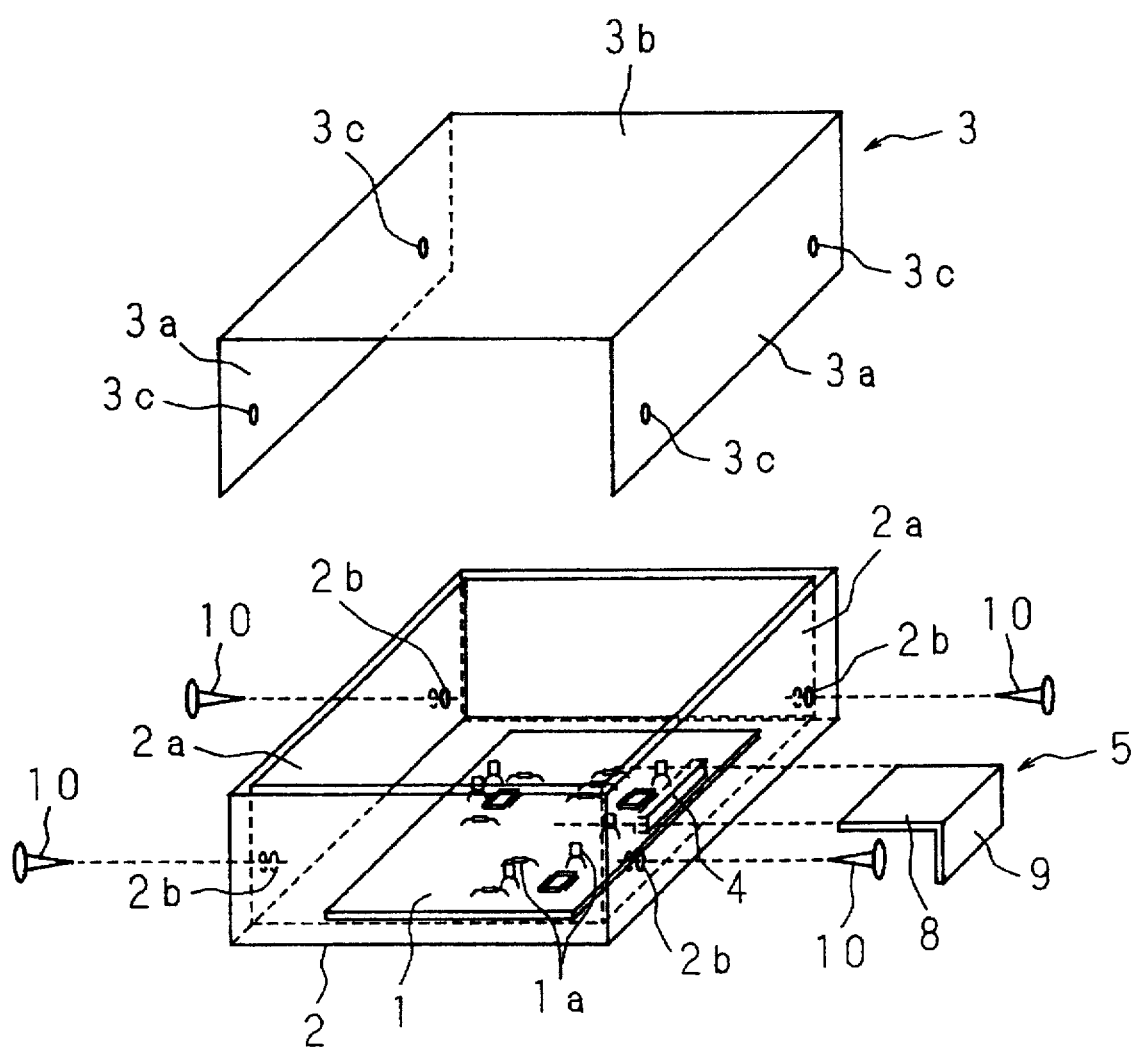
FIG. 4 is a perspective exploded view showing an example of electromagnetic shielding device of the present invention.
Figure 5:
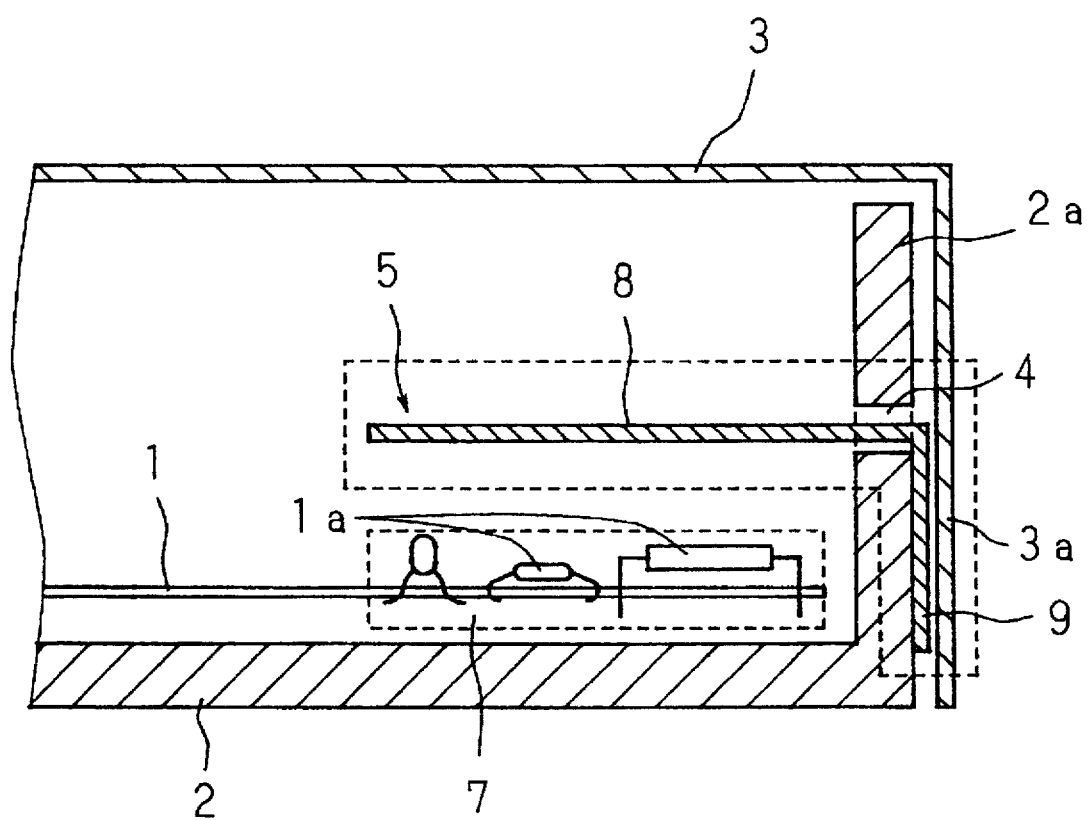
FIG. 5 is a schematic cross-section showing a main portion of the electromagnetic shielding device shown in FIG. 4.

Referring to FIGS. 4 and 5, the exemplary electromagnetic shielding device includes a printed circuit board 1 fixedly placed on the inside bottom of a top-open rectangular chassis 2 of plastic, and circuitry components 1a mounted on the printed circuit board. The chassis 2 has long sides 2a and short sides (not numbered), and substantially in the middle of one of the long sides is provided a slot 4 slightly above the heights of all the circuitry components 1a, the slot 4 being in parallel with the bottom of the chassis 2. The slot 4 is formed at a predetermined dimension along axial direction and the height direction. An electromagnetic shield 5 of metal or any other conductor is formed by bending into a letter L-shape a metal board which has a width substantially equal to that of the slot 4 and is thinner than the height of the slot 4.

More specifically, the shield 5 includes a tongue portion 8 and a leg portion 9, as a whole taking the form of letter L. The tongue portion 8 has a width and orthogonal length so that it is insertable in the slot 4 and coverable of the radiation position 7 of electromagnetic wave to be radiated from the circuitry components 1a. The leg portion 9 is bent downward so as to come into close contact with the long side 2a when the tongue portion 8 is inserted in the slot 4. The chassis 2 is covered with a covering 3 of metal or any other conductor taking the form of a channel with opposing sides 3a and a ceiling 3b connected between the sides 3a. The sides 3a and the ceiling 3b have the substantially same width as that of the long sides of the chassis 2. The distance between the sides 3a is adjusted such that when the covering 3 covers the chassis 2, there can be a slight space between the long sides 2a of the chassis 2 and the sides 3a.

Each of the long sides 2a of the chassis 2 is provided with screwed bores 2b close to the bottom section of each sides 2a in the width direction, and each of the sides 3a of the covering 3 is also provided with screw bores 3c which have a diameter substantially equal to the screwed bores 2a.

The manner of attaching the shield 5 to the electromagnetic shielding device will be described:

The printed circuit board 1 is fixed to the bottom of the chassis 2. Then, the shield 5 is attached to the chassis 2 with the tongue portion 8 being inserted through the slot 4 until it extends over the radiation position 7 in which the circuitry components 1a radiating electromagnetic wave is located, and the leg portion 9 is located outside the long side 2a having the slot 4. When the covering 3 is placed over the chassis 2, the leg portion 9 of the shield 5 is tightly sandwiched between the long side 2a of the chassis 2 and the side 3a of the covering 3 as shown in FIG. 5. The outside surface of the long side 2a having no slot 4 is opposed to the side 3a of the covering 3. In this way the shield 5 is prevented from inadvertently releasing from the slot 4.

In the state where the screw bores 2b of both sides 2a are opposed to the screw bores 3c, the covering 3 is fixed to the chassis 2 by inserting the screws 10 into the screw bores 2b through the screw bores 3c. The leg portion 9 of the shield 5 is securely held between the long sides 2a of the chassis 2 and the side 3a of the covering 3. The leg portion 9 functions as a spacer between the two sides 2a and 3a. In this way the shield 5 is secured to the chassis 2 without use of any fastening means such as screws. This saves the toil of fixing the shield 5 to the chassis 2, thereby reducing the steps of assembling and the production cost. The tongue portion 8 of the shield 5 is extended over the circuitry components 1a, and wholly covers the radiation position 7 as shown in FIG. 5, so that a eddy current is induced to the tongue portion 8. The eddy-current loss and diffusion of current energy which occurs by contacting the shield 5 with the covering shield radiated electromagnetic wave. No special site is required for providing the shield 5 on the printed circuit board 1, thereby leaving a sufficient site for mounting circuitry components 1a.

EXAMPLE 2

Figure 6:
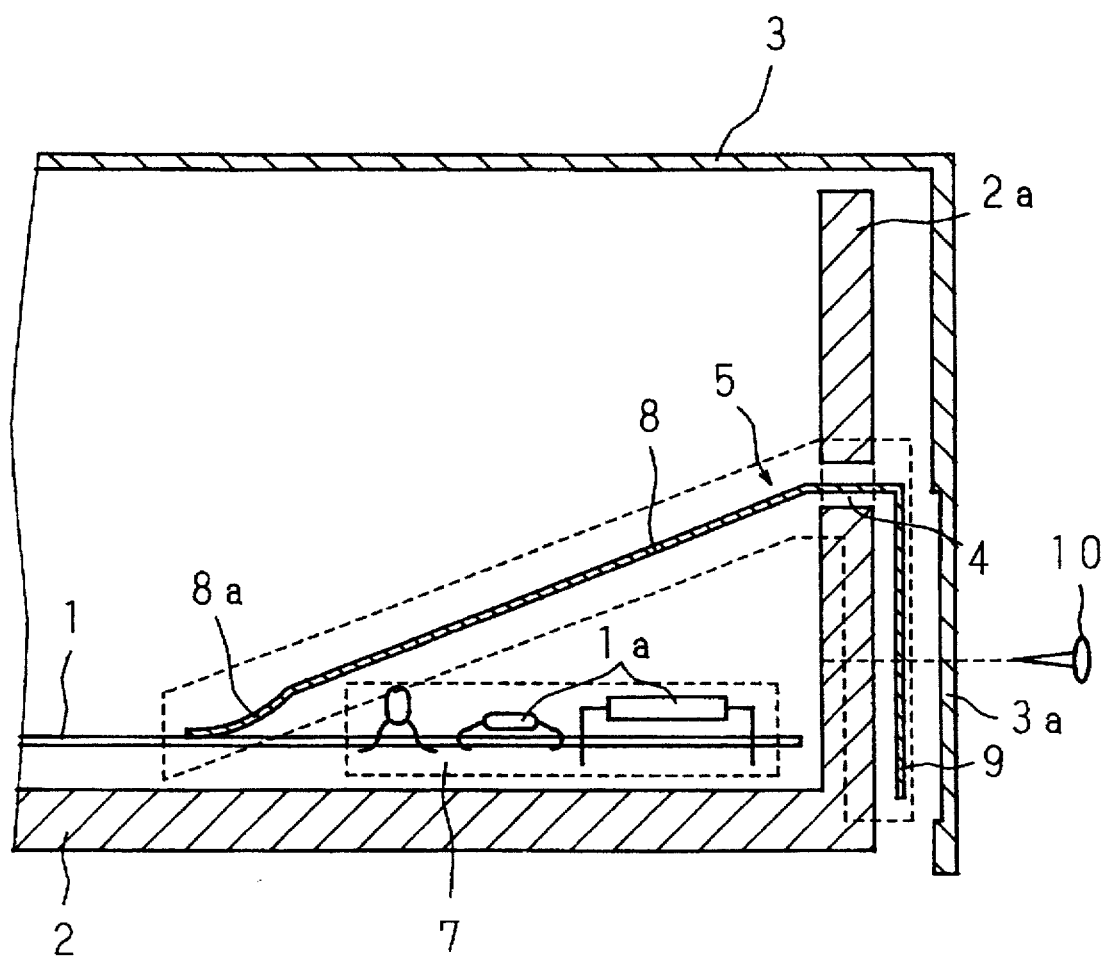
FIG. 6 is a schematic cross-sectional view showing another example of the present invention.

Referring to FIG. 6, a second example of the embodiment will be described:

This embodiment is different from Example 1 in that the shield 5 is placed such that the tongue portion 8 and the leg portion 9 of the shield 5 are formed to make a smaller angle than 90° and the tongue portion 8 is inclined downwards. The tongue portion 8 is located over the radiation position 7 in which electromagnetic wave on the printed circuit board 1 is radiated. In addition, the top end 8a of the tongue portion 8 is thinned so as to be springy, and is kept in contact with a predetermined position which is a predetermined low-impedance reference potential section of the printed circuit board 1 where a resist of copper foil is removed.

The shield 5 is prevented from moving about in the slot 4 because of the identically formed cross-section of the tongue portion 8. In the same manner as shown in FIG. 4, by fixing the covering 3 to the chassis 2 by means of the screws 10, the leg portion 9 is securely tightly sandwiched held between the long side 2a of the chassis 2 and the side 3a of the covering 3. In FIG. 6, like reference numerals designate like components and elements to those in FIG. 5.

Since the shield 5 is maintained at a reference potential for a low-impedance circuit, the electromagnetic wave radiated from the circuitry components 1a is prevented from affecting the potential of the shield 5, thereby preventing the radiation of electromagnetic wave. In Example 2, in the same manner as shown in FIG. 5 no fastening means such as screws is required for fixing the shield 5 to the chassis 2, thereby reducing the production cost because of the reduced number of assembling steps and fastening means.

According to the structure of the electromagnetic shielding device as shown in FIG. 6, by fixing the covering 3 to the chassis 2, the leg portion 9 of the shield 5 is securely fixed by being kept in contact with both the side 3a of the covering 3 and the long side 2a of the chassis 2. If the covering 3 is made of metal or any other conductor, the covering 3 and the shield 5 are electrically connected to each other. However, since the covering 3 is kept at a reference potential of a low-impedance circuit, the potential of the covering 3 is not affected by electromagnetic wave, thereby enabling the covering 3 to function as an electromagnetic shield.

EXAMPLE 3

Figure 7:
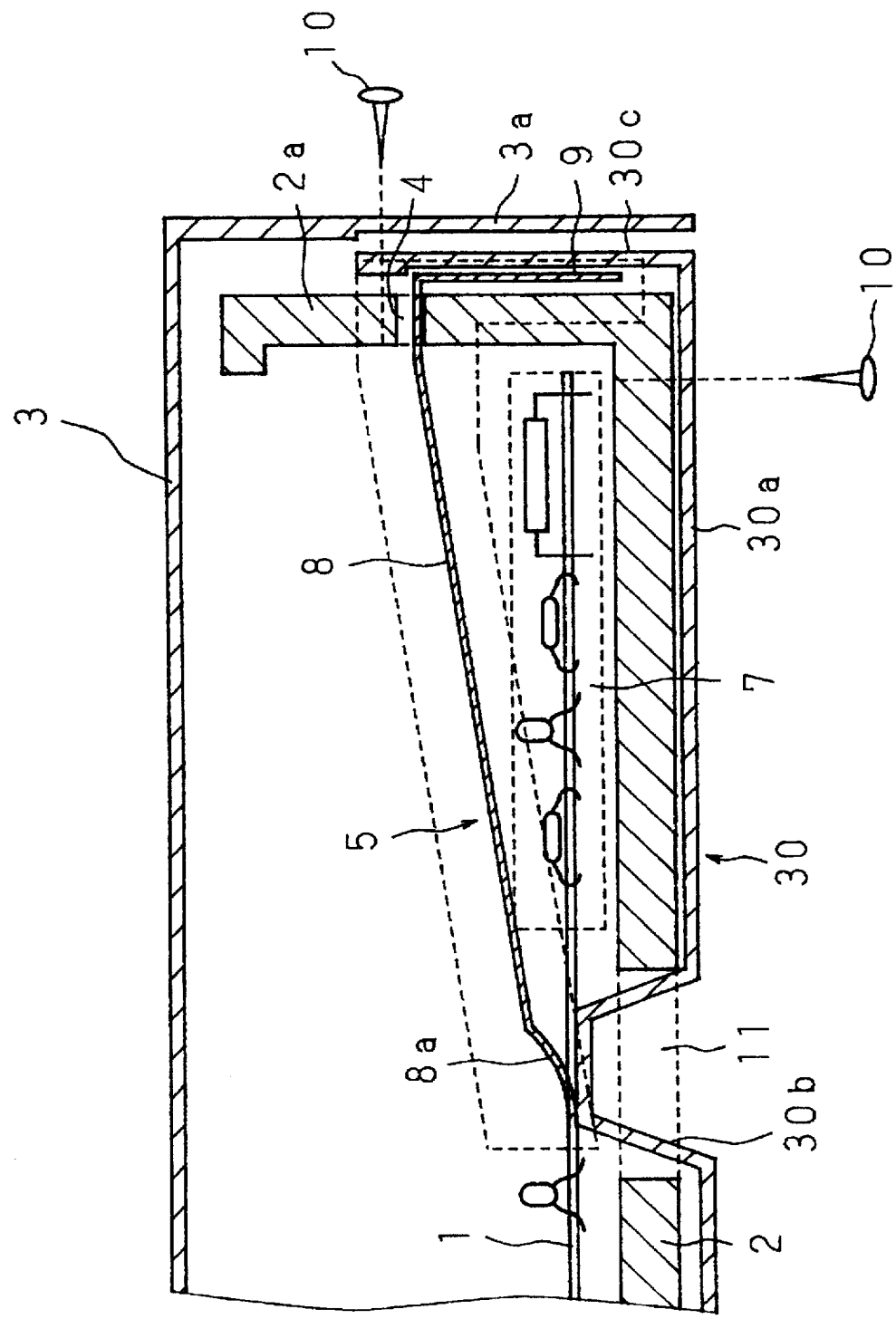
FIG. 7 is a schematic cross-sectional view showing a third example of the present invention.

Referring to FIG. 7, wherein like reference numerals designate like components and elements to those in FIG. 6, a third example of the embodiment will be described:

Example 3 is different from Examples 1 and 2 in that in addition to the covering 3, a tray 30 of the same size and material as those of the covering 3 is used for accepting the chassis 2. The tray 30 includes a shield portion 30a and a protrusion 30b which projects into the chassis 2 through an opening 11 produced the bottom of the chassis 2. The protrusion 30b is trapezoidal in cross-section, and has its top surface kept in contact with a low-impedance reference potential section of the circuit in the undersurface of the printed circuit board 1.

In Example 3, unlike Example 2, the leg portion 9 of the shield 5 is tightly sandwiched between the long side 2a of the chassis 2 and an erected side 30c of the tray 30. A side 3a of the covering 3 is located outside the erected side 30c of the covering 30. In this way the long side 2a of the chassis 2, the leg portion 9 of the shield 5, the erected side 30c of the tray 30 and the side 3a of the covering 3 are electrically connected to each other in a physically stable manner. The screws 10 are fixed slightly above the slot 4. The printed circuit board 1 and the tray 30 are mutually joined by means of screws 10 passed through the bottom 30a of the chassis 2. The other configuration is the same as that shown in FIG. 6, and corresponding parts are designated by the same characters and the explanation of these corresponding parts is omitted.

In the electromagnetic shielding device described above, like Example 2, the production cost is reduced because of the reduced number of assembling steps and fastening means. If the covering 3 is made of metal or any other conductor, since the covering 3 and the tray 30 are electrically connected to the shield 5 held at a reference potential for the low-impedance circuit, they as a whole function as a shield against the radiation of electromagnetic wave from the circuitry components 1a; more specifically, the upward and downward radiation of electromagnetic wave is prevented by the tray 30 and the shield 5, and the upward radiation is dually prevented by the covering 3 and the shield 5.

EXAMPLE 4

Figure 8:
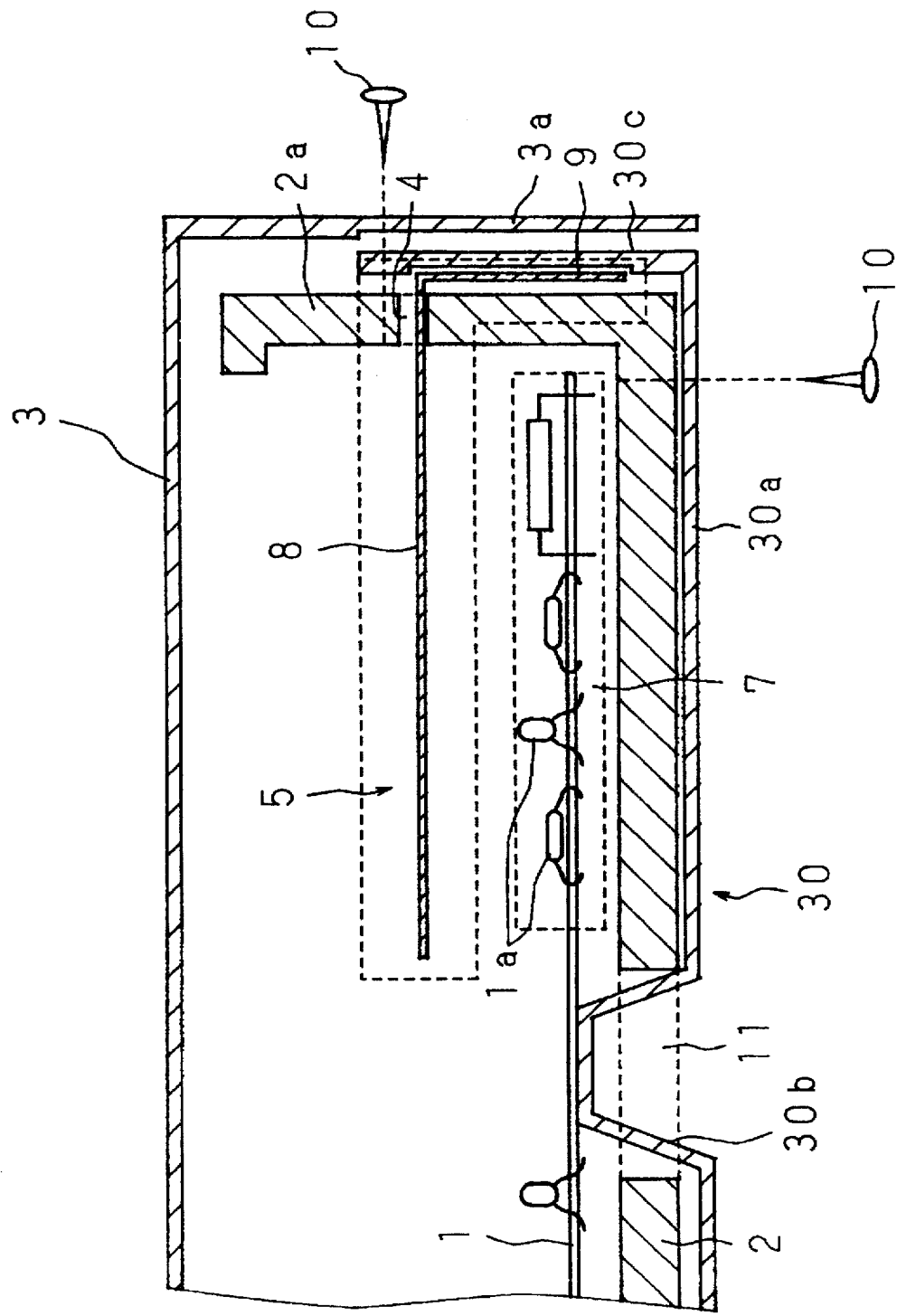
FIG. 8 is a schematic cross-sectional view showing a fourth example of the present invention.

Referring to FIG. 8, wherein like reference numerals designate like components and elements to those in FIG. 5, a fourth example of the embodiment will be described:

Example 4 is different from Example 3 in that the shield 5 is horizontally held in the chassis 2 as Example 1 shown in FIG. 5, and the remaining structure is the same as Example 3 in that the shielding protrusion 30a having a trapezoidal cross-section 30b is used, the leg portion 9 of the shield 5 is tightly sandwiched between the long side 2a of the chassis 2 and the erected side 30c of the tray 30, with the additional covering provided by the side 3a of the covering 3. In this way the electro-magnetic wave is prevented from radiation.

In the electromagnetic shielding device having such structure, the covering 3, the tray 30 and the shield 5 are fixed at a reference potential of a circuit having a low impedance. As a result, the potential of the covering 3, the tray 30 and the shield 5 is not affected by radiating electromagnetic wave, thereby enabling the shield 5 and the covering 3 to function as double electromagnetic shields to prevent the radiation of electromagnetic wave to the upward section of the printed circuit board 1. Also, the tray 30 functions as a electromagnetic shield to prevent the radiation of electromagnetic wave to the downward section of the printed circuit board 1. When the covering 3 is placed on the chassis 2, the shield 5 and the tray 30 can be securely fixed by the side 3a of the covering 3 and the side 2a of the chassis 2.

EXAMPLE 5

Figure 9:
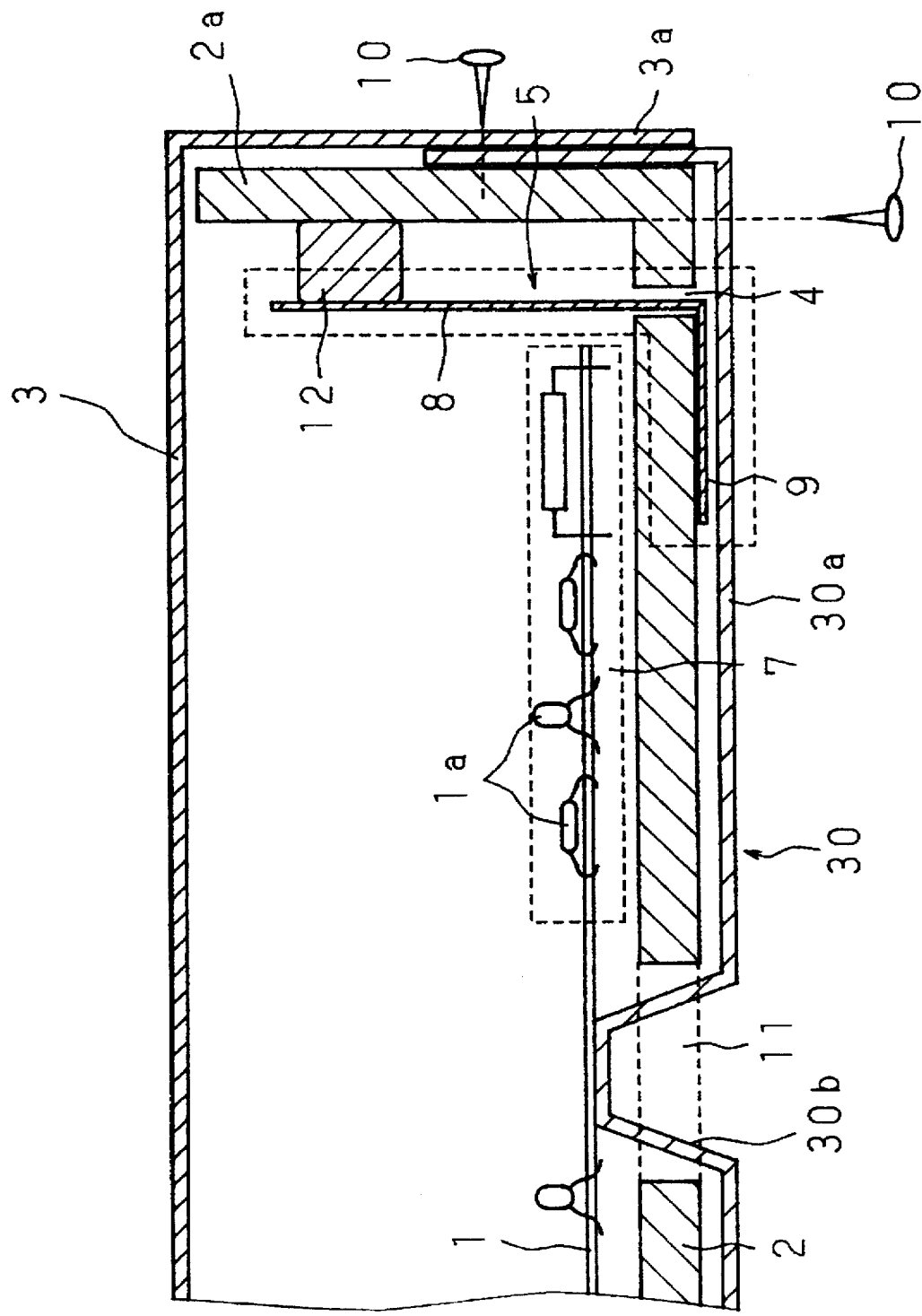
FIG. 9 is a schematic cross-sectional view showing a fifth example of the present invention.

Referring to FIG. 9, wherein like reference numerals designate like components and elements to those in FIG. 5, a fifth example of the embodiment will be described:

Example 5 is different from Examples 1 to 4 in that the slot 4 is produced at one end which is closest to the printed circuit board 1 in the bottom of the chassis 2a, and the slot 11 is produced at the other end. The slot 4 is formed at a predetermined dimension, being inserted in parallel into the side 2a. The shield 5 having a letter L-shape is inserted into the slot 4. The tongue portion 8 is placed in parallel with the side 2a. The tongue portion 8 of the shield 5 to extend upright until it reaches adjacent to the top end of the side 2a of the chassis 2, and the leg portion 9 is kept in contact with the bottom of the chassis 2. The tongue portion 8 of the shield 5 is supported by an insulating spacer 12 interposed against the top end of the side 2a of the chassis 2.

If the shield 5 is resilient and tends to vibrate, it is prevented from coming into collision with the circuitry components (not shown) inside the chassis 2. The leg portion 9 of the shield 5 is tightly sandwiched between the bottom of the chassis 2 and the bottom 30a of the tray 30. The bottom 30a of the tray 30 is also provided with the tray 30 having the protrusion 30b which is trapezoidal in the cross-section, and the protrusion 30b functions as a shield. The top surface of the protrusion 30b is extended through the opening 11 in the bottom of the chassis 2, and is kept in contact with a low-impedance reference potential section of the circuit on the printed circuit board 1.

The tray 30, the leg portion 9 of the shield 5, and the chassis 2 are securely joined together by means of screws 10 passed through the bottom 30a of the tray 30, thereby fixing the shield 5 to the chassis 2. The covering 3 is joined to the chassis 2 by means of screws 10 passed through the side 3a of the covering 3.

Since the tongue portion 8 of the shield 5 is held upright in the chassis 2, a sufficient site is allowed for mounting circuitry components inside the chassis 2, without reducing the effect of electromagnetic shield. As a result, the number of screws and assembling steps is reduced. Since the shield 5 is kept at a reference potential having a low impedance, the radiation of electromagnetic wave from the circuitry components 1a on the printed circuit board 1 to the side 2a of the chassis 2 can be prevented by the shield 5. Also, the radiation of electromagnetic wave from the printed circuit board 1 to the upward and downward section thereof can be prevented by the covering 3 and the tray 30. Since the top end of the tongue portion 8 of the shield 5 is supported by the side 2a of the chassis 2, the effect of the electromagnetic shield is not reduced and it is prevented from coming into collision with the circuitry components 1a and damaging them even if the tongue portion 8 is resilient and tends to vibrate.

The above-mentioned examples describe an electromagnetic shielding device which shields electromagnetic wave radiated from a printed circuit board within electronic appliances being provided the device. The invention is not restricted to this. The electromagnetic shielding device which shields electromagnetic wave being transferred from the outside of the electronic appliances to the interior may be used.

As described above, according to Example 1, since the shield is not kept in contact with the printed circuit board, a space for mounting a covering is not restricted.

According to the example described above, the covering is fixed so that the shield is securely sandwiched between the covering and the chassis. As a result, no fastening means is required for fixing the shield, thereby reducing the production cost because of the reduced number of assembling steps and fastening means.

As the shield is kept in contact with a reference potential of a circuit, the potential of the shield is not affected by electromagnetic wave, thereby enabling the shield to function as a stable electromagnetic shield.

The covering and the shield are electrically connected to each other. As the covering is kept at the reference potential of the circuit, the potential of the covering is not affected by electromagnetic wave, thereby enabling the covering to function as a stable electromagnetic shield.

According to Example 5, if the shield is resilient and tends to vibrate, it is prevented from coming into collision with the circuitry components and damaging them, without reducing the effect of electromagnetic shield.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

What is claimed is:

1. An electromagnetic shielding device for use in an electronic appliance, comprising:
    a chassis having a slot therein; and
    an electromagnetic wave shield member, a tongue portion of said electromagnetic wave shield member protruding through the slot of said chassis so as to be over a source generating an electromagnetic wave, a leg portion of said electromagnetic wave shield member being located outside of said chassis.

2. The electromagnetic shielding device according to claim 1, wherein the leg portion of said shield member located outside said chassis is supported by said chassis.

3. An electromagnetic shielding device for use in an electronic appliance, comprising:
    a chassis having a slot therein;
    a cover for covering said chassis; and
    an electromagnetic wave shield member, a tongue portion of said shield member protruding through the slot of said chassis so as to be over a source generating an electromagnetic wave, a leg portion of said electromagnetic wave shield member being located outside said chassis and being supported by said cover and said chassis.

4. The electromagnetic shielding device according to claim 3, wherein said cover is made of conductive material, and is electrically connected to said shield member.

5. An electromagnetic shielding device for use in an electronic appliance having a printed circuit board, comprising:
    a chassis having a slot therein;
    a printed circuit board housed in said chassis; and
    an electromagnetic wave shield member, a tongue portion of said electromagnetic wave shield member protruding through the slot of said chassis so as to be perpendicular to said printed circuit board, a leg portion of said shield member being located outside said chassis.

6. The electromagnetic shielding device according to claim 5, wherein said shield member is electrically connected to a reference potential section of the circuitry components on said printed circuit board.

7. The electromagnetic shielding device according to claim 5, wherein the leg portion of said shield member located outside said chassis is supported by said chassis.

8. An electromagnetic shielding device for use in an electronic appliance, comprising:
    a chassis having a slot therein;
    a printed circuit board housed in said chassis;
    a cover for covering said chassis; and
    an electromagnetic wave shield member, a tongue portion of said electromagnetic wave shield member protruding through the slot of the chassis so as to be over circuitry components on the printed circuit board, a leg portion of said electromagnetic wave shield member being located outside said chassis and being supported by said cover and said chassis.

9. The electromagnetic shielding device according to claim 8, wherein said cover is made of conductive material, and is electrically connected to said shield member.

10. The electromagnetic shielding device according to claim 8, wherein said shield member is electrically connected to a reference potential section of the circuitry components on the printed circuit board.

11. The electromagnetic shielding device according to claim 8, wherein said cover is electrically connected to a reference potential section of the circuitry components on the printed circuit board.

12. The electromagnetic shielding device according to claim 9, wherein said cover is electrically connected to a reference potential section of the circuitry components on the printed circuit board.

13. The electromagnetic shielding device according to claim 10, wherein said cover is made of conductive material, and is electrically connected to the shield member.

14. The electromagnetic shielding device according to claim 13, wherein said cover is electrically connected to the reference potential section of the circuitry components on the printed circuit board.

15. An electromagnetic shielding device according to claim 1, wherein the tongue portion and the leg portion of said shield member together form an L shape.

16. An electromagnetic shielding device according to claim 1, wherein the tongue portion of said shield member protruding through the slot of said chassis is substantially parallel with a bottom surface of said chassis and is positioned at a height slightly above the electromagnetic wave generating source.

17. An electromagnetic shielding device according to claim 1, wherein the tongue portion of said shield member protruding through the slot of said chassis declines toward a bottom surface of said chassis.

18. The electromagnetic shielding device according to claim 5, further comprising:

a tray supporting said chassis.

19. An electromagnetic shielding device according to claim 18, wherein a protrusion portion of said tray protrudes through an opening of said chassis so as to contact a reference potential section of the circuitry components on said printed circuit board.

20. An electromagnetic shielding device according to claim 18, wherein said tray includes a recessed portion which houses the leg portion of said shield member located outside said chassis.

21. An electromagnetic shielding device according to claim 18, wherein the leg portion of said shield member located outside said chassis is tightly sandwiched between said chassis and said tray.

22. An electromagnetic shielding device according to claim 3, wherein said cover is attached to said chassis with a fastener.

23. An electromagnetic shielding device according to claim 3, wherein the leg portion of said shield member located outside said chassis is tightly sandwiched between said chassis and said cover.

* * * * *